(12) United States Patent
Saji

(10) Patent No.: US 10,250,226 B2
(45) Date of Patent: *Apr. 2, 2019

(54) ELASTIC WAVE DEVICE, HIGH-FREQUENCY FRONT END CIRCUIT, AND COMMUNICATION APPARATUS

(71) Applicant: Murata Manufacturing Co., Ltd., Nagaokakyo-shi, Kyoto-fu (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/702,827

(22) Filed: Sep. 13, 2017

(65) Prior Publication Data

US 2018/0145658 A1    May 24, 2018

(30) Foreign Application Priority Data

Nov. 24, 2016 (JP) ................. 2016-227747

(51) Int. Cl.
| | |
|---|---|
| *H03H 9/25* | (2006.01) |
| *H03H 9/02* | (2006.01) |
| *H03H 9/145* | (2006.01) |
| *H01L 41/047* | (2006.01) |
| *H01L 41/053* | (2006.01) |
| *H01Q 23/00* | (2006.01) |

(52) U.S. Cl.
CPC .......... *H03H 9/25* (2013.01); *H01L 41/0477* (2013.01); *H01L 41/0533* (2013.01); *H03H 9/02559* (2013.01); *H03H 9/14541* (2013.01); *H01Q 23/00* (2013.01)

(58) Field of Classification Search
CPC ... H01L 41/0477; H01L 41/0533; H03H 9/25; H03H 9/02559; H03H 9/14541
USPC ........................................................ 343/909
See application file for complete search history.

(56) References Cited

U.S. PATENT DOCUMENTS

| | | | |
|---|---|---|---|
| 2009/0302709 A1 | 12/2009 | Mimura | |
| 2010/0148626 A1 | 6/2010 | Warashina et al. | |
| 2010/0259129 A1* | 10/2010 | Kadota | H03H 9/02559 310/313 B |
| 2010/0277036 A1* | 11/2010 | Shimizu | H03H 9/0222 310/313 B |
| 2013/0285768 A1* | 10/2013 | Watanabe | H03H 9/0222 333/193 |

(Continued)

FOREIGN PATENT DOCUMENTS

| | | |
|---|---|---|
| JP | 2006-295976 A | 10/2006 |
| JP | 2012-175315 A | 9/2012 |

(Continued)

*Primary Examiner* — Lam T Mai
(74) *Attorney, Agent, or Firm* — Keating & Bennett, LLP

(57) ABSTRACT

An elastic wave device includes a piezoelectric substrate, an IDT electrode including a first electrode layer which is provided on the piezoelectric substrate and contains Pt as a main component and a second electrode layer which is laminated on the first electrode layer and contains Cu as a main component, and a dielectric film that is provided on the piezoelectric substrate and covers the IDT electrode. The piezoelectric substrate is made of lithium niobate. The dielectric film is made of silicon oxide. The elastic wave device uses Rayleigh waves propagating along the piezoelectric substrate.

15 Claims, 9 Drawing Sheets

(56) References Cited

U.S. PATENT DOCUMENTS

| | | | | |
|---|---|---|---|---|
| 2014/0167881 A1* | 6/2014 | Iwasaki | ................... | H03H 9/25 |
| | | | | 333/133 |
| 2014/0191619 A1* | 7/2014 | Ito | ........................... | H03H 3/08 |
| | | | | 310/358 |
| 2014/0232239 A1* | 8/2014 | Iwasaki | .............. | H03H 9/02984 |
| | | | | 310/313 C |
| 2015/0288346 A1* | 10/2015 | Nakamura | ............. | H03H 9/205 |
| | | | | 333/133 |
| 2016/0006410 A1* | 1/2016 | Miyanari | ........... | H03H 9/02992 |
| | | | | 333/133 |
| 2016/0359468 A1* | 12/2016 | Taniguchi | .......... | H03H 9/02574 |
| 2017/0047905 A1* | 2/2017 | Araki | ................. | H03H 9/02535 |
| 2017/0236991 A1 | 8/2017 | Nakagawa | | |
| 2017/0237406 A1* | 8/2017 | Sekiya | .................... | H03H 3/08 |
| | | | | 310/313 B |
| 2017/0279432 A1* | 9/2017 | Murase | ................. | H03H 9/145 |
| 2017/0358728 A1* | 12/2017 | Sekiya | ................... | H01L 23/29 |
| 2017/0359049 A1* | 12/2017 | Toyota | .................... | H03H 9/25 |
| 2018/0062612 A1* | 3/2018 | Daimon | ............. | H03H 9/14532 |
| 2018/0091118 A1* | 3/2018 | Saji | .......................... | H03H 7/38 |
| 2018/0175282 A1* | 6/2018 | Saji | .................... | H03H 9/02834 |
| 2018/0182950 A1* | 6/2018 | Shimono | ............. | H01L 41/0533 |

FOREIGN PATENT DOCUMENTS

| | | |
|---|---|---|
| KR | 10-2010-0041843 A | 4/2010 |
| WO | 2008/108215 A1 | 9/2008 |
| WO | 2016/088543 A1 | 6/2016 |

\* cited by examiner

ELASTIC WAVE DEVICE, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2016-227747 filed on Nov. 24, 2016. The entire contents of each application are hereby incorporated herein by reference.

BACKGROUND OF THE INVENTION

1. Field of the Invention

The present invention relates to an elastic wave device, a high-frequency front end circuit, and a communication apparatus.

2. Description of the Related Art

An existing elastic wave device has been widely used for a filter of a cellular phone, and other suitable devices. Japanese Unexamined Patent Application Publication No. 2012-175315 discloses an example of the elastic wave device. The elastic wave device includes a piezoelectric substrate made of $LiNbO_3$. An interdigital transducer (IDT) electrode is provided on the piezoelectric substrate. The IDT electrode includes a multilayer metal film formed by laminating a NiCr layer, a Pt layer, a Ti layer, an Al layer, and a Ti layer in this order from the piezoelectric substrate side. A dielectric film made of $SiO_2$ is provided on the piezoelectric substrate so as to cover the IDT electrode. Frequency temperature characteristics are improved by including the above-described dielectric film. In the elastic wave device disclosed in Japanese Unexamined Patent Application Publication No. 2012-175315, the IDT electrode includes the Pt layer and the Al layer and, therefore, has a large reflection coefficient and a low electrical resistance.

When the film thickness of the dielectric film made of silicon oxide, such as $SiO_2$, is increased, the frequency temperature characteristic (TCV) is improved but a fractional bandwidth is narrowed. On the other hand, when the film thickness of the dielectric film made of silicon oxide is decreased, the fractional bandwidth is widened but the frequency temperature characteristic is deteriorated. In this manner, the frequency temperature characteristic and the fractional bandwidth have a trade-off relationship.

In the elastic wave device as disclosed in Japanese Unexamined Patent Application Publication No. 2012-175315, it is considered that the film thickness of the Al layer is increased in order to further lower the electrical resistance of the IDT electrode for reducing insertion loss of a filter. However, the inventors of preferred embodiments of the present invention have discovered that there is a problem of deterioration in the trade-off relationship between the frequency temperature characteristic and the fractional bandwidth because as the film thickness of the Al film is increased, the frequency temperature characteristic is deteriorated and the fractional bandwidth is not widened substantially.

SUMMARY OF THE INVENTION

Preferred embodiments of the present invention provide elastic wave devices, high-frequency front end circuits, and communication apparatuses that are capable of improving a trade-off relationship between a frequency temperature characteristic and a fractional bandwidth while lowering an electrical resistance of an IDT electrode.

An elastic wave device according to a preferred embodiment of the present invention includes a piezoelectric substrate, an IDT electrode including a first electrode layer which is provided on the piezoelectric substrate and contains Pt as a main component and a second electrode layer which is laminated on the first electrode layer and contains Cu as a main component, and a dielectric film that is provided on the piezoelectric substrate and covers the IDT electrode, wherein the piezoelectric substrate is made of lithium niobate, the dielectric film is made of silicon oxide, and the elastic wave device uses Rayleigh waves propagating along the piezoelectric substrate.

In an elastic wave device according to a preferred embodiment of the present invention, when a wavelength defined by an electrode finger pitch of the IDT electrode is $\lambda$, and a film thickness of the first electrode layer and a film thickness of the second electrode layer, which are normalized by the wavelength $\lambda$, are $h_{Pt}/\lambda$ (%) and $h_{Cu}/\lambda$ (%), respectively, the following equation 1 is preferably satisfied:

$$h_{Pt}/\lambda \geq -0.4 \times h_{Cu}/\lambda + 0.8 \qquad \text{Equation 1.}$$

In this case, a fractional bandwidth is able to be effectively and stably widened. Therefore, a trade-off relationship between a frequency temperature characteristic and the fractional bandwidth is further improved.

In an elastic wave device according to another preferred embodiment of the present invention, a total of a film thickness $h_{Pt}/\lambda$ of the first electrode layer and a film thickness $h_{Cu}/\lambda$ of the second electrode layer is preferably equal to or lower than about 20%, for example. In this case, productivity is improved.

In an elastic wave device according to another preferred embodiment of the present invention, Euler Angles ($\varphi$, $\theta$, $\psi$) of the piezoelectric substrate are preferably Euler Angles (0°±5°, $\theta$, 0°±5°), and a combination of a film thickness $h_{Pt}/\lambda$ of the first electrode layer, a film thickness $h_{Cu}/\lambda$ of the second electrode layer, and $\theta$ in the Euler Angles ($\varphi$, $\theta$, $\psi$) of the piezoelectric substrate is any one of combinations indicated in Table 1 to Table 6. In this case, spurious Shear Horizontal (SH) waves are reduced or prevented.

TABLE 1

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $h_{Cu}/\lambda \leq 5.5$ | $0.8 \leq h_{Pt}/\lambda < 1.25$ | $34.2 \leq \theta \leq 42.6$ |
| $h_{Cu}/\lambda \leq 5.5$ | $1.25 \leq h_{Pt}/\lambda < 1.75$ | $33.7 \leq \theta \leq 46.3$ |
| $h_{Cu}/\lambda \leq 5.5$ | $1.75 \leq h_{Pt}/\lambda < 2.25$ | $32.8 \leq \theta \leq 54$ |
| $h_{Cu}/\lambda \leq 5.5$ | $2.25 \leq h_{Pt}/\lambda \leq 2.75$ | $32.8 \leq \theta \leq 61$ |

TABLE 2

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $h_{Cu}/\lambda \leq 5.5$ | $3.5 \leq h_{Pt}/\lambda < 4.5$ | $16.3 \leq \theta \leq 30.8$ |
| $h_{Cu}/\lambda \leq 5.5$ | $4.5 \leq h_{Pt}/\lambda < 5.5$ | $17 \leq \theta \leq 34.7$ |
| $h_{Cu}/\lambda \leq 5.5$ | $5.5 \leq h_{Pt}/\lambda < 6.5$ | $19.8 \leq \theta \leq 35.8$ |
| $h_{Cu}/\lambda \leq 5.5$ | $6.5 \leq h_{Pt}/\lambda < 7.5$ | $21 \leq \theta \leq 36.3$ |
| $h_{Cu}/\lambda \leq 5.5$ | $7.5 \leq h_{Pt}/\lambda \leq 8.5$ | $21.5 \leq \theta \leq 36.6$ |

TABLE 3

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
| --- | --- | --- |
| $5.5 < h_{Cu}/\lambda \le 8.5$ | $0.8 \le h_{Pt}/\lambda < 1.25$ | $32.6 \le \theta \le 54.7$ |
| $5.5 < h_{Cu}/\lambda \le 8.5$ | $1.25 \le h_{Pt}/\lambda < 1.75$ | $32.3 \le \theta \le 65.5$ |
| $5.5 < h_{Cu}/\lambda \le 8.5$ | $1.75 \le h_{Pt}/\lambda \le 2.25$ | $34.5 \le \theta \le 55.5$ |

TABLE 4

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
| --- | --- | --- |
| $5.5 < h_{Cu}/\lambda \le 8.5$ | $2.5 \le h_{Pt}/\lambda < 3.5$ | $14.7 \le \theta \le 29.5$ |
| $5.5 < h_{Cu}/\lambda \le 8.5$ | $3.5 \le h_{Pt}/\lambda < 4.5$ | $20.2 \le \theta \le 34.2$ |
| $5.5 < h_{Cu}/\lambda \le 8.5$ | $4.5 \le h_{Pt}/\lambda < 5.5$ | $19 \le \theta \le 35.5$ |
| $5.5 < h_{Cu}/\lambda \le 8.5$ | $5.5 \le h_{Pt}/\lambda < 6.5$ | $20.5 \le \theta \le 36.2$ |
| $5.5 < h_{Cu}/\lambda \le 8.5$ | $6.5 \le h_{Pt}/\lambda < 7.5$ | $21.2 \le \theta \le 36.5$ |
| $5.5 < h_{Cu}/\lambda \le 8.5$ | $7.5 \le h_{Pt}/\lambda \le 8.5$ | $21.5 \le \theta \le 36.7$ |

TABLE 5

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
| --- | --- | --- |
| $8.5 < h_{Cu}/\lambda \le 11.5$ | $0.8 \le h_{Pt}/\lambda \le 1.25$ | $33 \le \theta \le 56.5$ |

TABLE 6

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
| --- | --- | --- |
| $8.5 < h_{Cu}/\lambda \le 11.5$ | $2.0 \le h_{Pt}/\lambda < 3.0$ | $14.3 \le \theta \le 30.9$ |
| $8.5 < h_{Cu}/\lambda \le 11.5$ | $3.0 \le h_{Pt}/\lambda < 4.0$ | $15 \le \theta \le 34.3$ |
| $8.5 < h_{Cu}/\lambda \le 11.5$ | $4.0 \le h_{Pt}/\lambda < 5.0$ | $18.8 \le \theta \le 35.5$ |
| $8.5 < h_{Cu}/\lambda \le 11.5$ | $5.0 \le h_{Pt}/\lambda < 6.0$ | $20.2 \le \theta \le 36.2$ |
| $8.5 < h_{Cu}/\lambda \le 11.5$ | $6.0 \le h_{Pt}/\lambda < 7.0$ | $20.8 \le \theta \le 36.5$ |
| $8.5 < h_{Cu}/\lambda \le 11.5$ | $7.0 \le h_{Pt}/\lambda \le 8.0$ | $21.2 \le \theta \le 36.8$ |

A high-frequency front end circuit according to another preferred embodiment of the present invention includes an elastic wave device according to a preferred embodiment of the present invention and a power amplifier.

A communication apparatus according to another preferred embodiment of the present invention includes a high-frequency front end circuit according to a preferred embodiment of the present invention, an RF (Radio Frequency) signal processing circuit, and a baseband signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described with reference to specific preferred embodiments of the present invention and the drawings.

It should be noted that respective preferred embodiments which are described in the specification are exemplary and partial replacement or combination of components between different preferred embodiments is able to be made.

Figure 1:
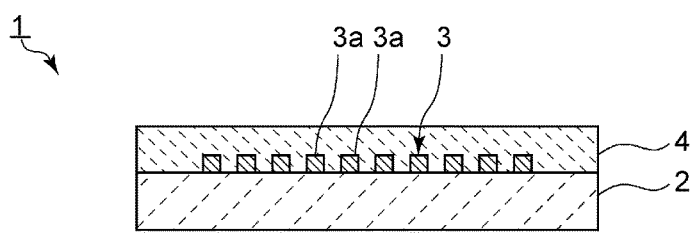
FIG. 1 is a cross-sectional front view of an elastic wave device according to a first preferred embodiment of the present invention.
Figure 2:
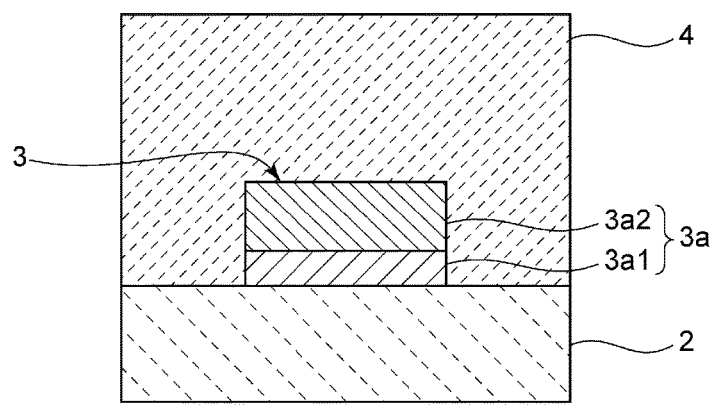
FIG. 2 is an enlarged cross-sectional front view of an electrode finger of an IDT electrode in the first preferred embodiment of the present invention.

FIG. 1 is a cross-sectional front view of an elastic wave device according to a first preferred embodiment of the present invention. FIG. 2 is an enlarged cross-sectional front view of an electrode finger of an IDT electrode in the first preferred embodiment of the present invention.

An elastic wave device 1 illustrated in FIG. 1 uses Rayleigh waves. The elastic wave device 1 includes a piezoelectric substrate 2 made of lithium niobate. In the present preferred embodiment, Euler Angles (φ, θ, ψ) of the piezoelectric substrate 2 are preferably Euler Angles (0°, 37.5°, 0°), for example. It should be noted that the Euler Angles (φ, θ, ψ) of the piezoelectric substrate 2 are not limited to the above-described angles.

An IDT electrode 3 is provided on the piezoelectric substrate 2. The IDT electrode 3 includes a plurality of electrode fingers 3a. A dielectric film 4 is provided on the piezoelectric substrate 2 so as to cover the IDT electrode 3. In the present preferred embodiment, the dielectric film 4 is preferably made of $SiO_2$, for example.

It should be noted that silicon oxide other than $SiO_2$ may also be used as the material of the dielectric film 4. The above-described silicon oxide is not limited to $SiO_2$ and is expressed by $SiO_x$ (x is an integer).

As illustrated in FIG. 2, the IDT electrode 3 includes a first electrode layer 3a1 and a second electrode layer 3a2. The IDT electrode 3 includes a multilayer metal film formed by laminating the first electrode layer 3a1 and the second electrode layer 3a2. In the present preferred embodiment, the first electrode layer 3a1 is provided on the piezoelectric substrate 2 and the second electrode layer 3a2 is laminated on the first electrode layer 3a1. The first electrode layer 3a1 is preferably made of Pt, for example. The second electrode layer 3a2 is preferably made of Cu, for example. It should be noted that the IDT electrode 3 may include an electrode layer other than the first and second electrode layers 3a1 and 3a2 in a range without impairing the effect of the present preferred embodiment.

When a wavelength defined by an electrode finger pitch of the IDT electrode 3 is λ and the film thickness of the metal layer is $h_M$, the film thickness of the metal layer, which is normalized by the wavelength λ, is $T_M$. In this case, $T_M = h_M/\lambda$ (%)×100 is satisfied. In the specification, the film thickness of the metal layer, which is normalized by the wavelength λ, is $h_M/\lambda$ (%). The film thickness of the first electrode layer 3a1, the film thickness of the second electrode layer 3a2, and the film thickness of the dielectric film 4, which are normalized by the wavelength λ, are $h_{Pt}/\lambda$ (%), $h_{Cu}/\lambda$ (%), and $h_S/\lambda$ (%), respectively. In this case, in the present preferred embodiment, the film thickness $h_{Pt}/\lambda$ of the first electrode layer is preferably about 2%, for example. It should be noted that the film thickness $h_{Pt}/\lambda$ is not limited to the above-described one.

The present preferred embodiment has the characteristics that the IDT electrode 3 includes the first electrode layer 3a1 made of Pt and the second electrode layer 3a2 made of Cu. Therefore, a trade-off relationship between a frequency temperature characteristic (TCV) and a fractional bandwidth is able to be improved while lowering an electrical resistance of the IDT electrode.

The improvement in the trade-off relationship between the frequency temperature characteristic (TCV) and the fractional bandwidth indicates improvement of one of the frequency temperature characteristic (TCV) and the fractional bandwidth while reducing deterioration of the other.

The above-described effect will be described below by comparing the present preferred embodiment and first to third comparative examples. In the present preferred embodiment, the electrical resistance of the IDT electrode 3 is able to be lowered because the second electrode layer 3a2 made of Cu with a low resistance is used. Furthermore, the fractional bandwidth is able to be efficiently improved by arranging the second electrode layer 3a2 made of Cu on the first electrode layer 3a1 made of Pt.

The first comparative example is different from a first preferred embodiment in that the second electrode layer is not provided. The second comparative example is different from the first preferred embodiment in that the second electrode layer in the IDT electrode is made of Al. The third comparative example is different from the first preferred embodiment in that the second electrode layer is made of Mg.

In the second comparative example, the film thickness of the second electrode layer, which is normalized by the wavelength $\lambda$, is $h_{Al}/\lambda$ (%). In the third comparative example, the film thickness of the second electrode layer, which is normalized by the wavelength $\lambda$, is $h_{Mg}/\lambda$ (%).

A plurality of elastic wave devices according to the first preferred embodiment and the second and third comparative examples were produced while varying the film thicknesses of the second electrode layers and the film thicknesses of the dielectric films. The plurality of elastic wave devices in the first comparative example were produced while varying the film thickness of the dielectric film. The frequency temperature characteristics (TCV) and the fractional bandwidths of the plurality of elastic wave devices described above were measured.

Figure 3:
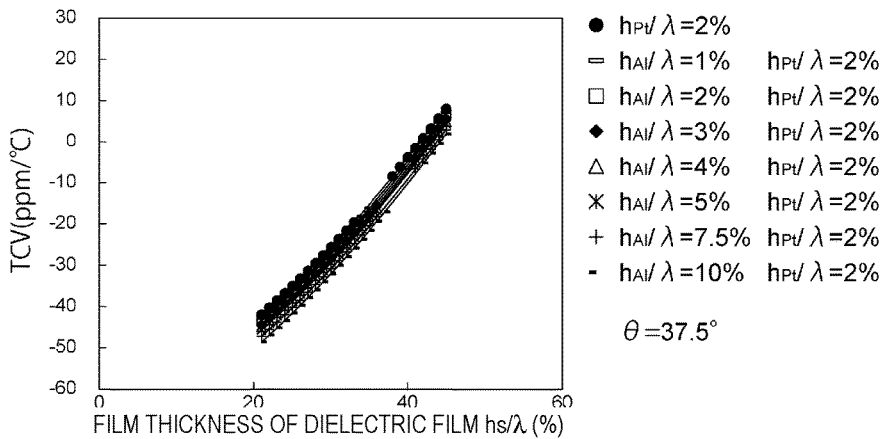
FIG. 3 is a graph indicating relationships among a film thickness $h_s/\lambda$ of a dielectric film, a film thickness $h_{Al}/\lambda$ of a second electrode layer, and a frequency temperature characteristic (TCV) in first and second comparative examples.
Figure 4:
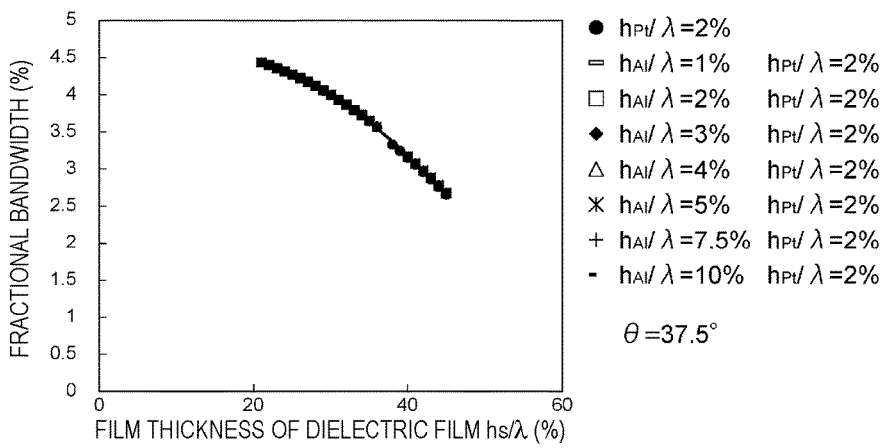
FIG. 4 is a graph indicating relationships among the film thickness $h_s/\lambda$ of the dielectric film, the film thickness $h_{Al}/\lambda$ of the second electrode layer, and a fractional bandwidth in the first and second comparative examples.
Figure 5:
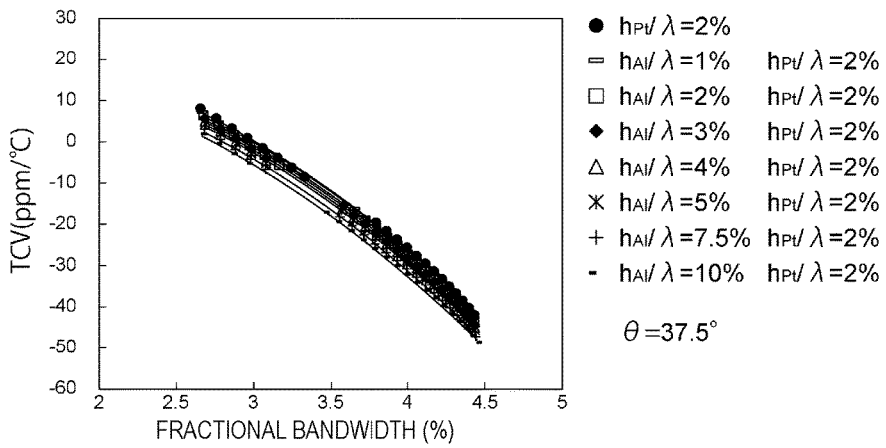
FIG. 5 is a graph indicating relationships between a trade-off relationship between the frequency temperature characteristic (TCV) and the fractional bandwidth and the film thickness $h_{Al}/\lambda$ of the second electrode layer in the first and second comparative examples.

FIG. 3 is a graph indicating relationships among the film thickness $h_s/\lambda$ of the dielectric film, the film thickness $h_{Al}/\lambda$ of the second electrode layer, and the frequency temperature characteristic (TCV) in the first and second comparative examples. FIG. 4 is a graph indicating relationships among the film thickness $h_s/\lambda$ of the dielectric film, the film thickness $h_{Al}/\lambda$ of the second electrode layer, and the fractional bandwidth in the first and second comparative examples. FIG. 5 is a graph indicating relationships between the trade-off relationship between the frequency temperature characteristic (TCV) and the fractional bandwidth and the film thickness $h_{Al}/\lambda$ of the second electrode layer in the first and second comparative examples. In the second comparative example, the film thickness $h_{Al}/\lambda$ of the second electrode layer is set to about 1%, about 2%, about 3%, about 4%, about 5%, about 7.5%, and about 10%, for example. On the other hand, the film thickness $h_{Al}/\lambda$ of the second electrode layer is 0 in the first comparative example. FIG. 3 to FIG. 5 illustrate results provided by varying the film thickness $h_{Al}/\lambda$ of the second electrode layer by showing the first and second comparative examples.

As illustrated in FIG. 3, it was discovered that as the film thickness $h_{Al}/\lambda$ of the second electrode layer is increased, an absolute value of the frequency temperature characteristic (TCV) is increased and the frequency temperature characteristic is deteriorated when the film thickness $h_s/\lambda$ of the dielectric film is the same or substantially the same in the first and second comparative examples. On the other hand, as illustrated in FIG. 4, it was discovered that even when the film thickness $h_{Al}/\lambda$ of the second electrode layer is varied, the fractional bandwidth does not vary substantially. Therefore, as illustrated in FIG. 5, as the film thickness $h_{Al}/\lambda$ of the second electrode layer is increased, the frequency temperature characteristic (TCV) is deteriorated when the fractional bandwidth is the same or substantially the same. Thus, in the second comparative example in which the second electrode layer is made of Al, as the film thickness $h_{Al}/\lambda$ of the second electrode layer is increased, the trade-off relationship is deteriorated.

Figure 6:
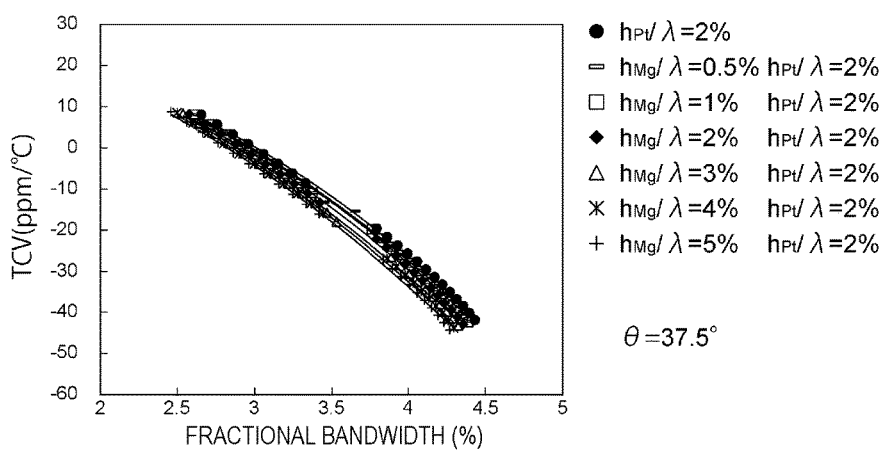
FIG. 6 is a graph indicating relationships between the trade-off relationship between the frequency temperature characteristic (TCV) and the fractional bandwidth and a film thickness $h_{Mg}/\lambda$ of a second electrode layer in the first comparative example and a third comparative example.

FIG. 6 is a graph indicating relationships between the trade-off relationship between the frequency temperature characteristic (TCV) and the fractional bandwidth and the film thickness $h_{Mg}/\lambda$ of the second electrode layer in the first and third comparative examples. In the third comparative example, the film thickness $h_{Mg}/\lambda$ of the second electrode layer is set to about 0.5%, about 1%, about 2%, about 3%, about 4%, and about 5%, for example. On the other hand, the film thickness $h_{Mg}/\lambda$ of the second electrode layer is 0 in the first comparative example. FIG. 6 illustrates results provided by varying the film thickness $h_{Mg}/\lambda$ of the second electrode layer by showing the first and third comparative examples.

As illustrated in FIG. 6, it was discovered that also in the third comparative example in which the second electrode layer is made of Mg, as the film thickness $h_{Mg}/\lambda$ of the second electrode layer is increased, the trade-off relationship between the frequency temperature characteristic (TCV) and the fractional bandwidth is deteriorated as in the second comparative example.

As described above, the inventors of the present invention have discovered the problem that as the film thickness of the second electrode layer is increased, the above-described trade-off relationship is deteriorated in some cases. In the first preferred embodiment, the trade-off relationship between the frequency temperature characteristic (TCV) and the fractional bandwidth is able to be improved because the second electrode layer is made of Cu. This effect is described with reference to FIG. 7 to FIG. 10 below.

Figure 7:
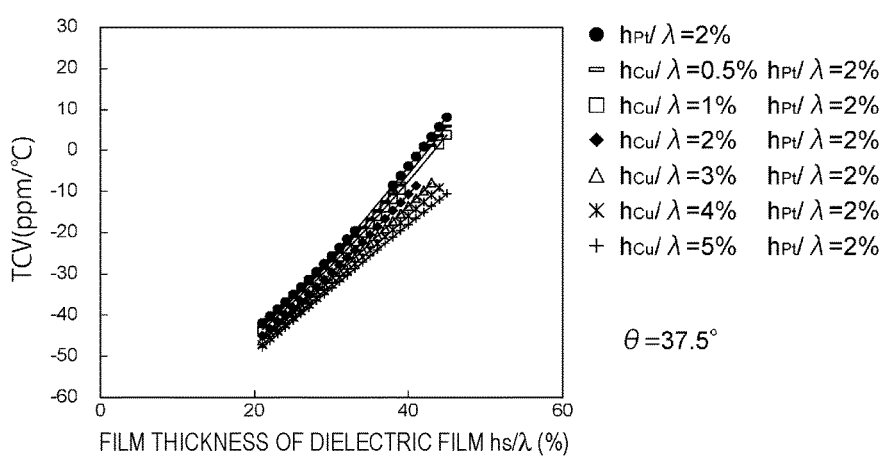
FIG. 7 is a graph indicating relationships among the film thickness $h_s/\lambda$ of the dielectric film, a film thickness $h_{Cu}/\lambda$ of a second electrode layer, and the frequency temperature characteristic (TCV) in a first preferred embodiment of the present invention and the first comparative example.
Figure 8:
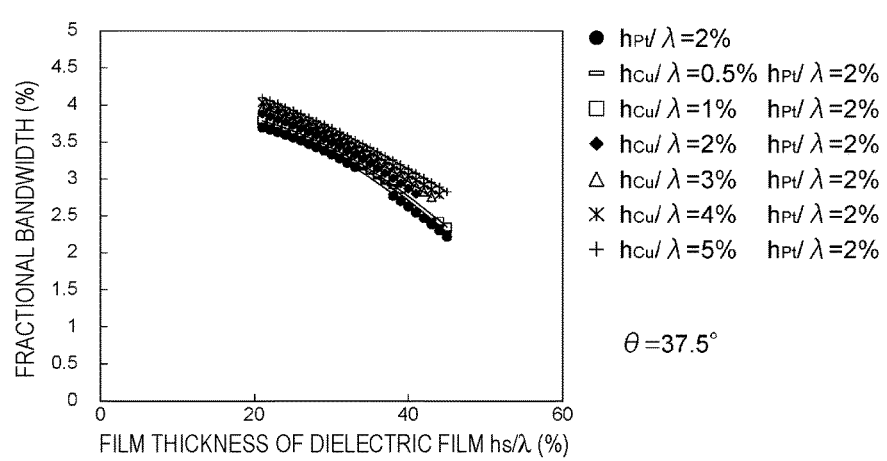
FIG. 8 is a graph indicating relationships among the film thickness $h_s/\lambda$ of the dielectric film, the film thickness $h_{Cu}/\lambda$ of the second electrode layer, and the fractional bandwidth in the first preferred embodiment of the present invention and the first comparative example.
Figure 9:
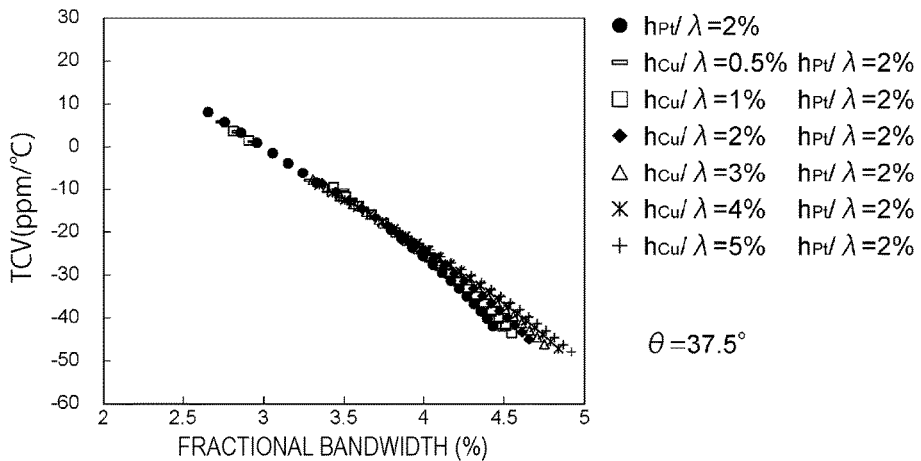
FIG. 9 is a graph indicating relationships between the trade-off relationship between the frequency temperature characteristic (TCV) and the fractional bandwidth and the film thickness $h_{Cu}/\lambda$ of the second electrode layer in the first preferred embodiment of the present invention and the first comparative example.

FIG. 7 is a graph indicating relationships among the film thickness $h_s/\lambda$ of the dielectric film, the film thickness $h_{Cu}/\lambda$ of the second electrode layer, and the frequency temperature characteristic (TCV) in the first preferred embodiment and the first comparative example. FIG. 8 is a graph indicating relationships among the film thickness $h_s/\lambda$ of the dielectric film, the film thickness $h_{Cu}/\lambda$ of the second electrode layer, and the fractional bandwidth in the first preferred embodiment and the first comparative example. FIG. 9 is a graph indicating relationships between the trade-off relationship between the frequency temperature characteristic (TCV) and the fractional bandwidth and the film thickness $h_{Cu}/\lambda$ of the second electrode layer in the first preferred embodiment and the first comparative example. In the first preferred embodiment, the film thickness $h_{Cu}/\lambda$ of the second electrode layer is set to about 0.5%, about 1%, about 2%, about 3%, about 4%, and about 5%, for example. On the other hand, the film thickness $h_{Cu}/\lambda$ of the second electrode layer is 0 in the first comparative example. FIG. 7 to FIG. 9 illustrate results provided by varying the film thickness $h_{Cu}/\lambda$ of the second electrode layer by showing the first preferred embodiment and the first comparative example.

As illustrated in FIG. 7, in the first preferred embodiment and the first comparative example, as the film thickness $h_{Cu}/\lambda$ of the second electrode layer is increased, the frequency temperature characteristic (TCV) is deteriorated when the film thickness $h_s/\lambda$ of the dielectric film is the same or substantially the same. As illustrated in FIG. 8, it was however discovered that in the first preferred embodiment, the fractional bandwidth is higher than that in the first comparative example, and as the film thickness $h_{Cu}/\lambda$ of the second electrode layer is increased, the fractional bandwidth is widened when the film thickness $h_s/\lambda$ of the dielectric film is the same or substantially the same. That is to say, using Cu for the second electrode layer provides an effect that the fractional bandwidth is widened although the frequency temperature characteristic (TCV) is deteriorated. As illustrated in FIG. 9, it was discovered that as the film thickness $h_{Cu}/\lambda$ of the second electrode layer is increased, the frequency temperature characteristic (TCV) is improved when the fractional bandwidth is the same or substantially the same. As described above, the trade-off relationship between the frequency temperature characteristic (TCV) and the fractional bandwidth is able to be improved in the first preferred embodiment.

Figure 10:
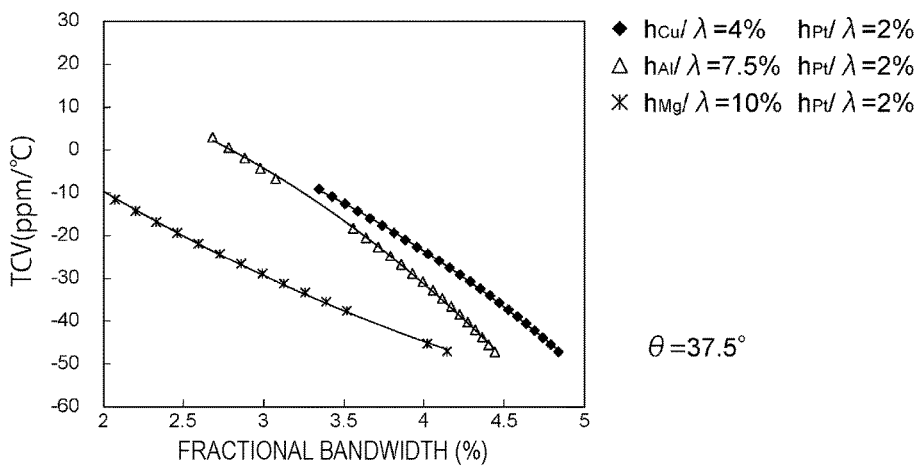
FIG. 10 is a graph indicating the trade-off relationships between the frequency temperature characteristic (TCV) and the fractional bandwidth in the first preferred embodiment of the present invention and the second and third comparative examples.

FIG. 10 is a graph indicating the trade-off relationships between the frequency temperature characteristic (TCV) and the fractional bandwidth in the first preferred embodiment and the second and third comparative examples. FIG. 10 indicates a result when the film thickness $h_{Cu}/\lambda$ of the second electrode layer is about 4% in the first preferred embodiment, a result when the film thickness $h_{Al}/\lambda$ of the second electrode layer is about 7.5% in the second comparative example, and a result when the film thickness $h_{Mg}/\lambda$ of the second electrode layer is about 10% in the third comparative example.

As illustrated in FIG. 10, it was discovered that the fractional bandwidth in the first preferred embodiment is wider than the fractional bandwidths in the second and third comparative examples when the frequency temperature characteristic (TCV) is the same or substantially the same. Thus, the trade-off relationship between the frequency temperature characteristic (TCV) and the fractional bandwidth is able to be effectively improved in the first preferred embodiment.

Furthermore, the second electrode layer is made of Cu and has the electrical resistance which is sufficiently lower than that of the first electrode layer made of Pt. Therefore, the above-described trade-off relationship is able to be improved and the electrical resistance of the IDT electrode is able to be effectively lowered by increasing the film thickness $h_{Cu}/\lambda$ of the second electrode layer.

A second preferred embodiment of the present invention will be described below.

An elastic wave device according to the second preferred embodiment is different from the first preferred embodiment in a relationship between the film thickness $h_{Pt}/\lambda$ of the first electrode layer and the film thickness $h_{Cu}/\lambda$ of the second electrode layer. The second preferred embodiment has the same or substantially the same configurations as those of the elastic wave device 1 in the first preferred embodiment illustrated in FIG. 1 other than the above-described point.

To be more specific, in the present preferred embodiment, the film thickness $h_{Pt}/\lambda$ of the first electrode layer and the film thickness $h_{Cu}/\lambda$ of the second electrode layer preferably have a relationship of the following equation 1:

$$h_{Pt}/\lambda \geq -0.4 \times h_{Cu}/\lambda + 0.8 \qquad \text{Equation 1.}$$

Energy of elastic waves is able to be effectively confined in the surface of the IDT electrode by satisfying Equation 1. This confinement is able to effectively widen the fractional bandwidth to further improve the trade-off relationship between the frequency temperature characteristic (TCV) and the fractional bandwidth. This effect will be described below.

Figure 11:
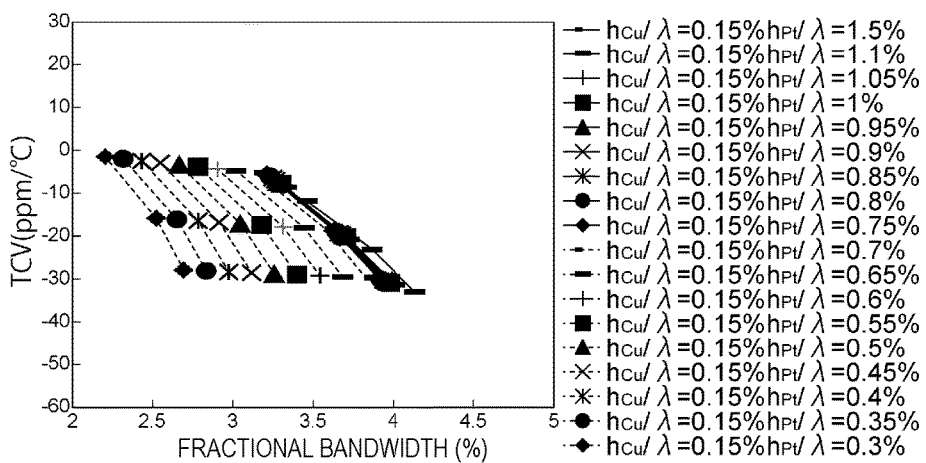
FIG. 11 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.15%.
Figure 12:
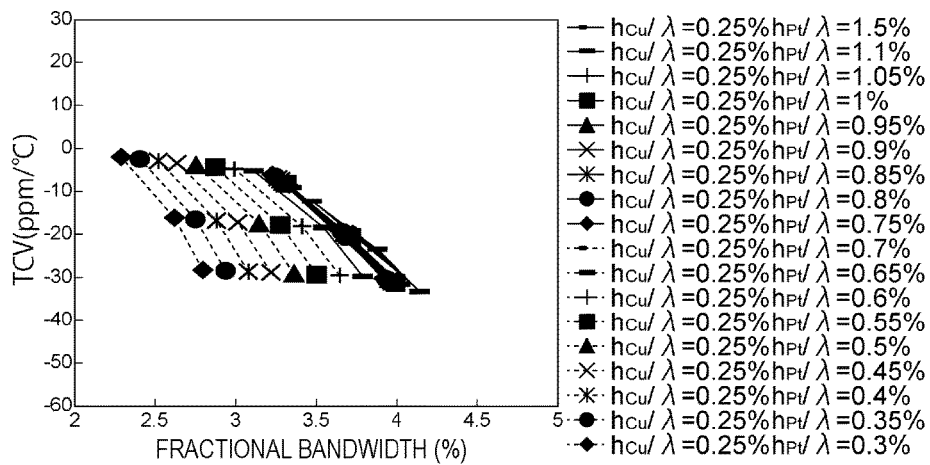
FIG. 12 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.25%.
Figure 13:
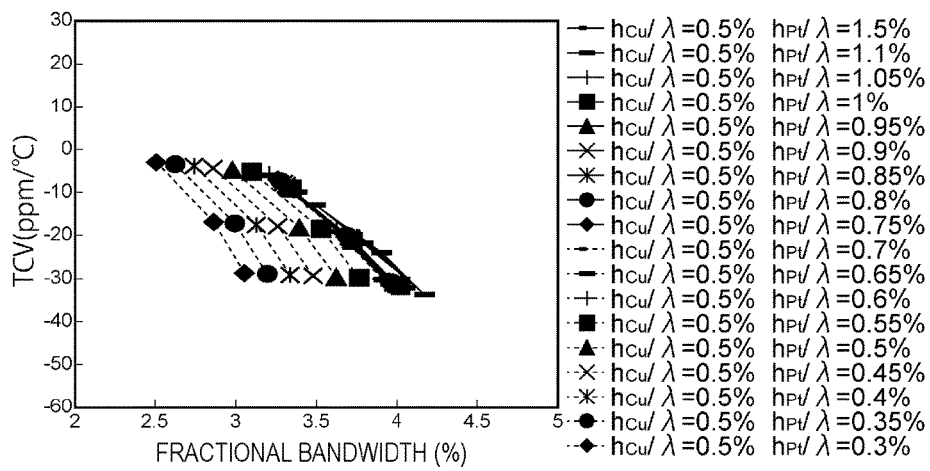
FIG. 13 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.5%.
Figure 14:
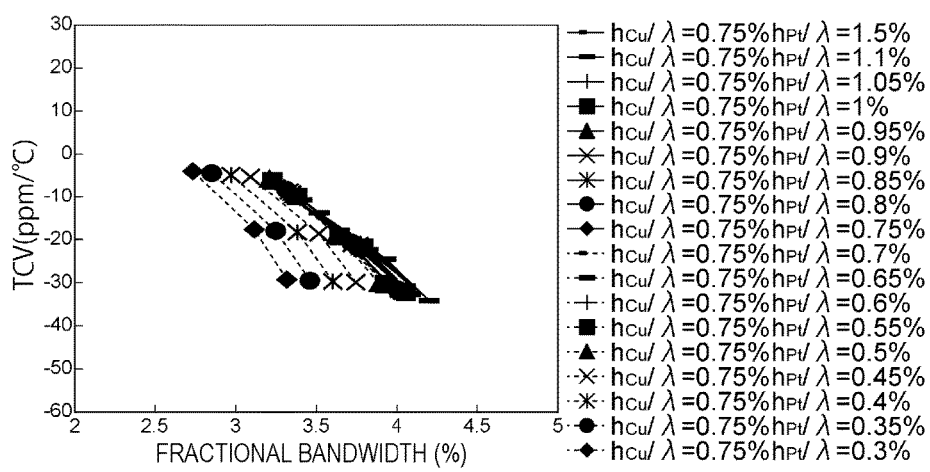
FIG. 14 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.75%.
Figure 15:
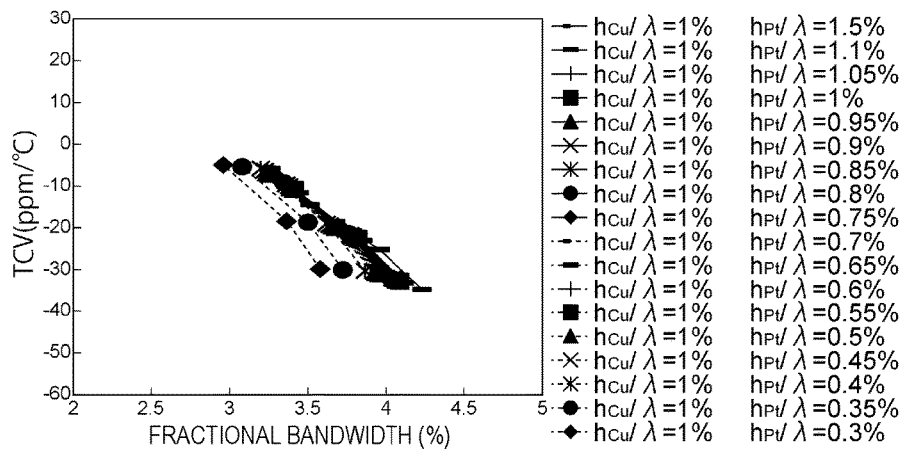
FIG. 15 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 1%.

FIG. 11 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.15%, for example. FIG. 12 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.25%, for example. FIG. 13 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.5%, for example. FIG. 14 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 0.75%. FIG. 15 is a graph indicating a relationship between the trade-off relationship between the frequency temperature characteristic (TCV) and the fractional bandwidth and the film thickness $h_{Pt}/\lambda$ of the first electrode layer when the film thickness $h_{Cu}/\lambda$ of the second electrode layer is about 1%, for example.

As illustrated in FIG. 11, as the film thickness $h_{Pt}/\lambda$ of the first electrode layer is increased, the fractional bandwidth is widened when the frequency temperature characteristic (TCV) is the same or substantially the same. Therefore, it was discovered that the trade-off relationship between the frequency temperature characteristic (TCV) and the fractional bandwidth is improved. In particular, it was discovered that under the condition in which the film thickness $h_{Pt}/\lambda$ of the first electrode layer is higher than about 0.7%, for example, variation in the fractional bandwidth relative to the film thickness $h_{Pt}/\lambda$ is largely decreased. In the same manner, as illustrated in FIG. 12 and FIG. 13, also in the case in which the film thickness $h_{Cu}/\lambda$ of the second electrode layer is about 0.25% to about 1%, for example, as the film thickness $h_{Pt}/\lambda$ of the first electrode layer is increased, the above-described trade-off relationship is able to be further improved. Furthermore, it was discovered that under the condition in which the film thickness $h_{Pt}/\lambda$ is higher than a certain value, variation in the fractional bandwidth is able to be largely decreased by increasing the film thickness $h_{Pt}/\lambda$ to be higher than the certain value.

In order to obtain the film thickness $h_{Pt}/\lambda$ of the first electrode layer with which the large fractional bandwidth is able to be stably provided, relationships between the film thickness $h_{Pt}/\lambda$ of the first electrode layer and the fractional bandwidth when the frequency temperature characteristic (TCV) was about −20 ppm/° C. in the cases in which the film thickness $h_{Cu}/\lambda$ of the second electrode layer was about 0.15%, about 0.25%, about 0.5%, about 0.75%, and about 1% were respectively calculated, for example.

Figure 16:
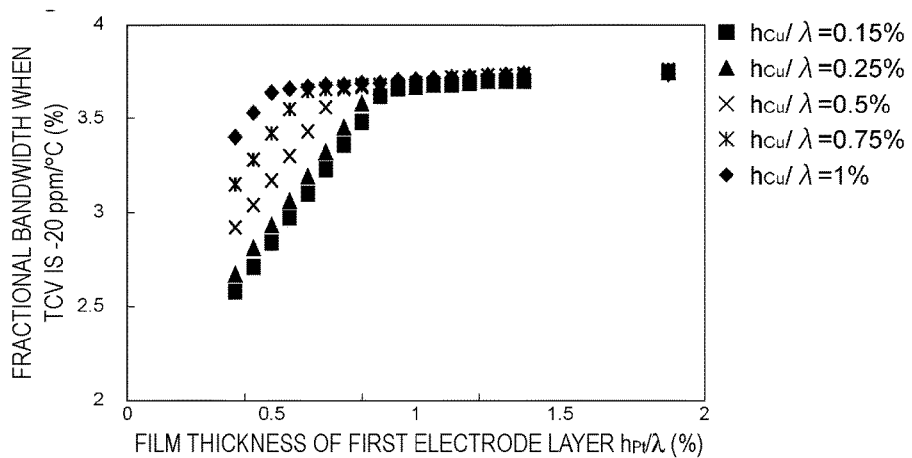
FIG. 16 is a graph indicating a relationship among the film thickness $h_{Pt}/\lambda$ of the first electrode layer, the film thickness $h_{Cu}/\lambda$ of the second electrode layer, and the fractional bandwidth when the frequency temperature characteristic (TCV) is about −20 ppm/° C.

FIG. 16 is a graph indicating a relationship among the film thickness $h_{Pt}/\lambda$ of the first electrode layer, the film thickness $h_{Cu}/\lambda$ of the second electrode layer, and the fractional bandwidth when the frequency temperature characteristic (TCV) is about −20 ppm/° C., for example.

As illustrated in FIG. 16, in the case in which the film thickness $h_{Cu}/\lambda$ of the second electrode layer is about 0.15%, when the film thickness $h_{Pt}/\lambda$ of the first electrode layer is equal to or higher than about 0.7%, for example, the fractional bandwidth is able to be effectively and stably widened. Therefore, the above-described trade-off relationship is able to be further improved. In the same manner, in the case in which the film thickness $h_{Cu}/\lambda$ of the second electrode layer is about 0.25%, when the film thickness $h_{Pt}/\lambda$ of the first electrode layer is equal to or higher than about 0.7%, for example, the fractional bandwidth is able to be effectively and stably widened and the above-described trade-off relationship is able to be further improved. In the case in which the film thickness $h_{Cu}/\lambda$ of the second electrode layer is about 0.5%, when the film thickness $h_{Pt}/\lambda$ of the first electrode layer is equal to or higher than about 0.6%, for example, the fractional bandwidth is able to be effectively and stably widened and the above-described trade-off can be further improved. In the case in which the film thickness $h_{Cu}/\lambda$ of the second electrode layer is about 0.75%, when the film thickness $h_{Pt}/\lambda$ of the first electrode layer is equal to or higher than about 0.5%, for example, the fractional bandwidth is able to be effectively and stably widened and the above-described trade-off is able to be further improved. In the case in which the film thickness $h_{Cu}/\lambda$ of the second electrode layer is about 1%, when the film thickness $h_{Pt}/\lambda$ of the first electrode layer is equal to or higher than about 0.4%, for example, the fractional bandwidth is able to be effectively and stably widened and the above-described trade-off is able to be further improved.

The relationship between the film thickness $h_{Cu}/\lambda$ of the second electrode layer and the film thickness $h_{Pt}/\lambda$ of the first electrode layer with which the fractional bandwidth is able to be stably widened was obtained from FIG. 16.

Figure 17:
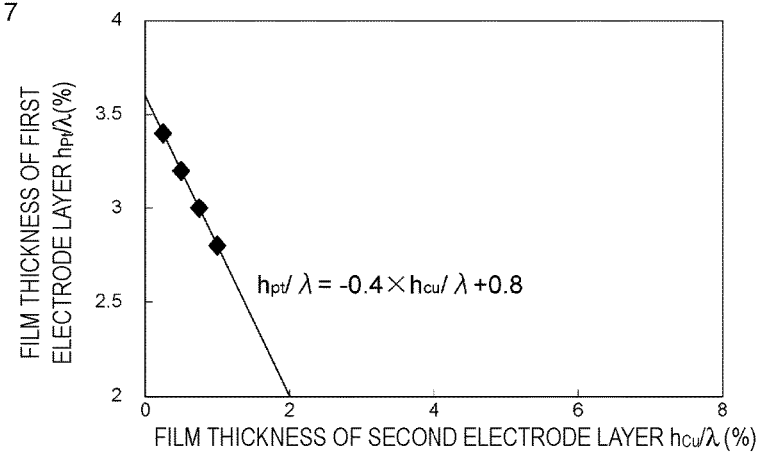
FIG. 17 is a graph indicating a relationship between the film thickness $h_{Cu}/\lambda$ of the second electrode layer and the film thickness $h_{Pt}/\lambda$ of the first electrode layer with which the fractional bandwidth can be widened stably.

FIG. 17 is a graph indicating a relationship between the film thickness $h_{Cu}/\lambda$ of the second electrode layer and the film thickness $h_{Pt}/\lambda$ of the first electrode layer with which the fractional bandwidth is able to be stably widened.

As illustrated in FIG. 17, when the film thickness $h_{Pt}/\lambda$ of the first electrode layer and the film thickness $h_{Cu}/\lambda$ of the second electrode layer have the relationship of the above-described equation 1, the fractional bandwidth is able to be widened stably. Accordingly, the trade-off relationship between the frequency temperature characteristic (TCV) and the fractional bandwidth is able to be further improved in the present preferred embodiment.

It is preferable that the total of the film thickness $h_{Pt}/\lambda$ of the first electrode layer and the film thickness $h_{Cu}/\lambda$ of the second electrode layer be equal to or lower than about 20%, for example. In this case, the IDT electrode is able to be easily formed in a manufacturing process of the elastic wave device, thereby improving the productivity.

A third preferred embodiment of the present invention will be described below.

An elastic wave device in the third preferred embodiment is different from the first preferred embodiment in a relationship among the film thickness $h_{Pt}/\lambda$ of the first electrode layer, the film thickness $h_{Cu}/\lambda$ of the second electrode layer, and the Euler Angles (φ, θ, ψ) of the piezoelectric substrate. The third preferred embodiment has the same or substantially the same configurations as those of the elastic wave device 1 in the first preferred embodiment illustrated in FIG. 1 other than the above-described points.

To be more specific, in the present preferred embodiment, the Euler Angles (φ, θ, ψ) of the piezoelectric substrate are preferably Euler Angles (0°, θ, 0°). A combination of the film thickness $h_{Pt}/\lambda$ of the first electrode layer, the film thickness $h_{Cu}/\lambda$ of the second electrode layer, and θ in the Euler Angles (φ, θ, ψ) of the piezoelectric substrate is any one of combinations indicated in Table 7 to Table 12.

TABLE 7

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $0.8 \leq h_{Pt}/\lambda < 1.25$ | $34.2 \leq \theta \leq 42.6$ |
| $h_{Cu}/\lambda \leq 5.5$ | $1.25 \leq h_{Pt}/\lambda < 1.75$ | $33.7 \leq \theta \leq 46.3$ |
| $h_{Cu}/\lambda \leq 5.5$ | $1.75 \leq h_{Pt}/\lambda < 2.25$ | $32.8 \leq \theta \leq 54$ |
| $h_{Cu}/\lambda \leq 5.5$ | $2.25 \leq h_{Pt}/\lambda \leq 2.75$ | $32.8 \leq \theta \leq 61$ |

TABLE 8

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $3.5 \leq h_{Pt}/\lambda < 4.5$ | $16.3 \leq \theta \leq 30.8$ |
| $h_{Cu}/\lambda \leq 5.5$ | $4.5 \leq h_{Pt}/\lambda < 5.5$ | $17 \leq \theta \leq 34.7$ |
| $h_{Cu}/\lambda \leq 5.5$ | $5.5 \leq h_{Pt}/\lambda < 6.5$ | $19.8 \leq \theta \leq 35.8$ |
| $h_{Cu}/\lambda \leq 5.5$ | $6.5 \leq h_{Pt}/\lambda < 7.5$ | $21 \leq \theta \leq 36.3$ |
| $h_{Cu}/\lambda \leq 5.5$ | $7.5 \leq h_{Pt}/\lambda \leq 8.5$ | $21.5 \leq \theta \leq 36.6$ |

TABLE 9

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $5.5 < h_{Cu}/\lambda \leq 8.5$ | $0.8 \leq h_{Pt}/\lambda < 1.25$ | $32.6 \leq \theta \leq 54.7$ |
| $5.5 < h_{Cu}/\lambda \leq 8.5$ | $1.25 \leq h_{Pt}/\lambda < 1.75$ | $32.3 \leq \theta \leq 65.5$ |
| $5.5 < h_{Cu}/\lambda \leq 8.5$ | $1.75 \leq h_{Pt}/\lambda \leq 2.25$ | $34.5 \leq \theta \leq 55.5$ |

TABLE 10

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $5.5 < h_{Cu}/\lambda \leq 8.5$ | $2.5 \leq h_{Pt}/\lambda < 3.5$ | $14.7 \leq \theta \leq 29.5$ |
| $5.5 < h_{Cu}/\lambda \leq 8.5$ | $3.5 \leq h_{Pt}/\lambda < 4.5$ | $20.2 \leq \theta \leq 34.2$ |
| $5.5 < h_{Cu}/\lambda \leq 8.5$ | $4.5 \leq h_{Pt}/\lambda < 5.5$ | $19 \leq \theta \leq 35.5$ |
| $5.5 < h_{Cu}/\lambda \leq 8.5$ | $5.5 \leq h_{Pt}/\lambda < 6.5$ | $20.5 \leq \theta \leq 36.2$ |
| $5.5 < h_{Cu}/\lambda \leq 8.5$ | $6.5 \leq h_{Pt}/\lambda < 7.5$ | $21.2 \leq \theta \leq 36.5$ |
| $5.5 < h_{Cu}/\lambda \leq 8.5$ | $7.5 \leq h_{Pt}/\lambda \leq 8.5$ | $21.5 \leq \theta \leq 36.7$ |

TABLE 11

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $8.5 < h_{Cu}/\lambda \leq 11.5$ | $0.8 \leq h_{Pt}/\lambda \leq 1.25$ | $33 \leq \theta \leq 56.5$ |

TABLE 12

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $8.5 < h_{Cu}/\lambda \leq 11.5$ | $2.0 \leq h_{Pt}/\lambda < 3.0$ | $14.3 \leq \theta \leq 30.9$ |
| $8.5 < h_{Cu}/\lambda \leq 11.5$ | $3.0 \leq h_{Pt}/\lambda < 4.0$ | $15 \leq \theta \leq 34.3$ |
| $8.5 < h_{Cu}/\lambda \leq 11.5$ | $4.0 \leq h_{Pt}/\lambda < 5.0$ | $18.8 \leq \theta \leq 35.5$ |
| $8.5 < h_{Cu}/\lambda \leq 11.5$ | $5.0 \leq h_{Pt}/\lambda < 6.0$ | $20.2 \leq \theta \leq 36.2$ |
| $8.5 < h_{Cu}/\lambda \leq 11.5$ | $6.0 \leq h_{Pt}/\lambda < 7.0$ | $20.8 \leq \theta \leq 36.5$ |
| $8.5 < h_{Cu}/\lambda \leq 11.5$ | $7.0 \leq h_{Pt}/\lambda \leq 8.0$ | $21.2 \leq \theta \leq 36.8$ |

The film thickness $h_{Pt}/\lambda$ of the first electrode layer, the film thickness $h_{Cu}/\lambda$ of the second electrode layer, and the Euler Angles (φ, θ, ψ) of the piezoelectric substrate have the above-described relationship, thereby reducing or preventing spurious SH wave. This will be described below.

Figure 18:
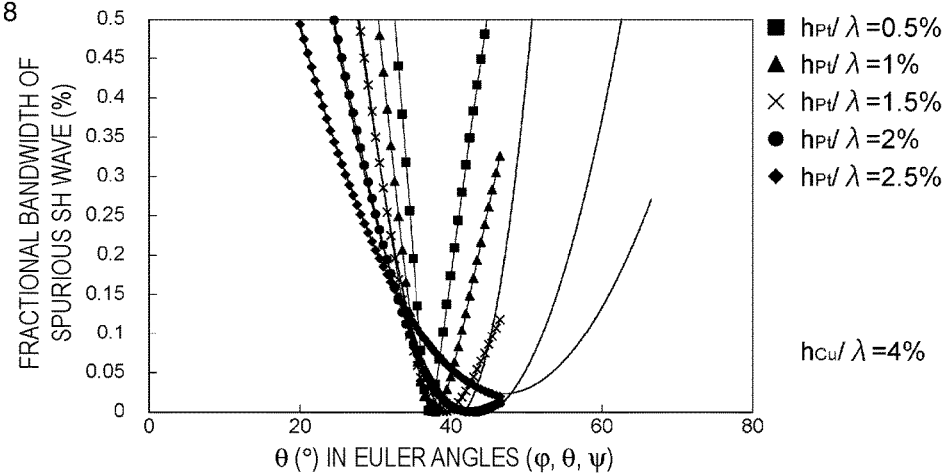
FIG. 18 is a graph indicating a relationship among the film thickness $h_{Pt}/\lambda$ of the first electrode layer, θ in Euler Angles (φ, θ, ψ), and a fractional bandwidth of spurious SH wave when the film thickness $h_{Cu}/\lambda$ of the second electrode layer is about 4% in a third preferred embodiment of the present invention.

FIG. 18 is a graph indicating a relationship among the film thickness $h_{Pt}/\lambda$ of the first electrode layer, θ in the Euler Angles (φ, θ, ψ), the fractional bandwidth of the spurious SH wave when the film thickness $h_{Cu}/\lambda$ of the second electrode layer is about 4% in the third preferred embodiment, for example. FIG. 18 illustrates the cases in which the film thickness $h_{Pt}/\lambda$ of the first electrode layer is about 0.5%, about 1%, about 1.5%, about 2%, and about 2.5%, for example.

As illustrated in FIG. 18, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and the Euler Angles (φ, θ, ψ) of the piezoelectric substrate as indicated in Table 7. Therefore, the spurious SH wave is able to be effectively reduced or prevented.

Figure 19:
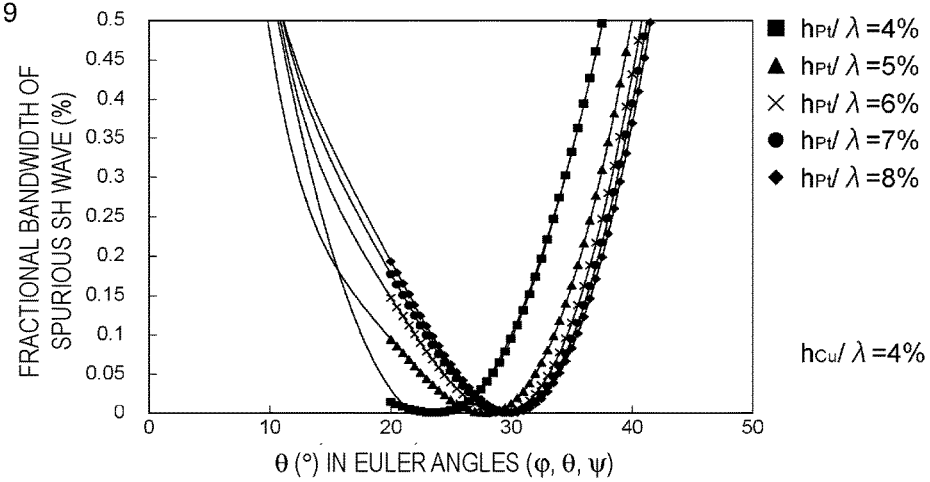
FIG. 19 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 4% in the third preferred embodiment of the present invention.

FIG. 19 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 4% in the third preferred embodiment, for example. FIG. 19 illustrates the cases in which the film thickness $h_{Pt}/\lambda$ of the first electrode layer is about 4%, about 5%, about 6%, about 7%, and about 8%, for example.

As illustrated in FIG. 19, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and the Euler Angles ($\varphi$, $\theta$, $\psi$) of the piezoelectric substrate as indicated in Table 8. Therefore, the spurious SH wave is able to be effectively reduce or prevented.

Figure 20:
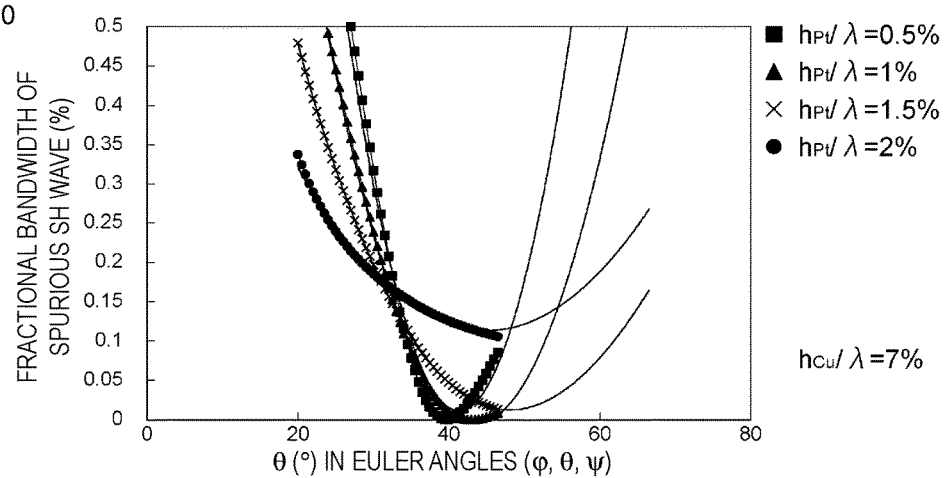
FIG. 20 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the third preferred embodiment of the present invention.

FIG. 20 is a graph indicating a relationship among the film thickness $h_{Pt}/\lambda$ of the first electrode layer, $\theta$ in the Euler Angles ($\varphi$, $\theta$, $\psi$), and the fractional bandwidth of the spurious SH wave when the film thickness $h_{Cu}/\lambda$ of the second electrode layer is about 7% in the third preferred embodiment, for example. FIG. 20 illustrates the cases in which the film thickness $h_{Pt}/\lambda$ of the first electrode layer is about 0.5%, about 1%, about 1.5%, and about 2%, for example.

As illustrated in FIG. 20, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate as indicated in Table 9. Therefore, the spurious SH wave is able to be effectively reduced or prevented.

Figure 21:
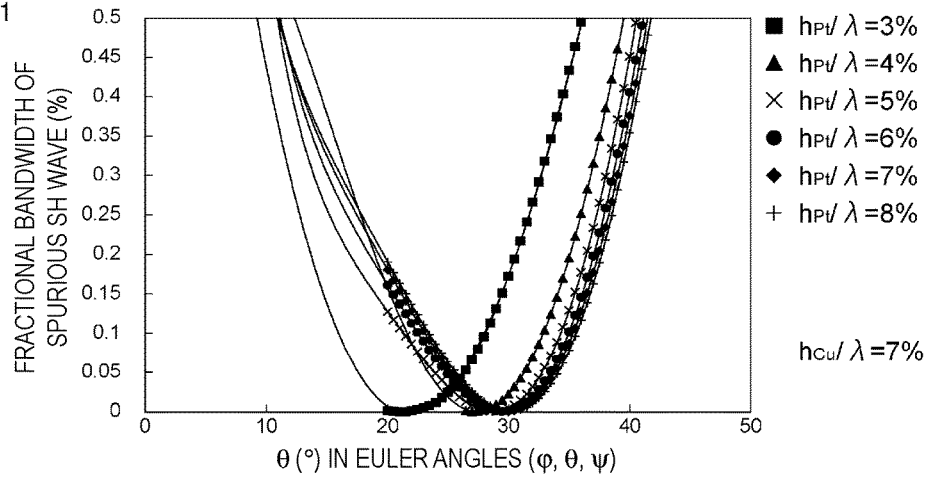
FIG. 21 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 7% in the third preferred embodiment of the present invention.

FIG. 21 is a graph indicating a relationship among the film thickness $h_{Pt}/\lambda$ of the first electrode layer, $\theta$ in the Euler Angles ($\varphi$, $\theta$, $\psi$), and the fractional bandwidth of the spurious SH wave when the film thickness $h_{Cu}/\lambda$ of the second electrode layer is about 7% in the third preferred embodiment, for example. FIG. 21 illustrates the cases in which the film thickness $h_{Pt}/\lambda$ of the first electrode layer is about 3%, about 4%, about 5%, about 6%, about 7%, and about 8%, for example.

As illustrated in FIG. 21, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate as indicated in Table 10. Therefore, the spurious SH wave is able to be effectively reduced or prevented.

Figure 22:
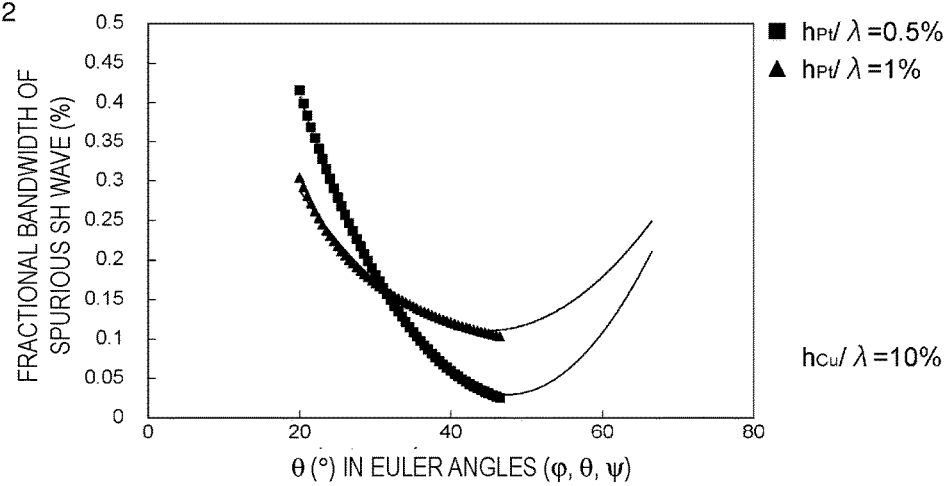
FIG. 22 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 10% in the third preferred embodiment of the present invention.

FIG. 22 is a graph indicating a relationship among the film thickness $h_{Pt}/\lambda$ of the first electrode layer, $\theta$ in the Euler Angles ($\varphi$, $\theta$, $\psi$), and the fractional bandwidth of the spurious SH wave when the film thickness $h_{Cu}/\lambda$ of the second electrode layer is about 10% in the third preferred embodiment, for example. FIG. 22 illustrates the cases in which the film thickness $h_{Pt}/\lambda$ of the first electrode layer is about 0.5% and about 1%, for example.

As illustrated in FIG. 22, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate as indicated in Table 11. Therefore, the spurious SH wave is able to be effectively reduced or prevented.

Figure 23:
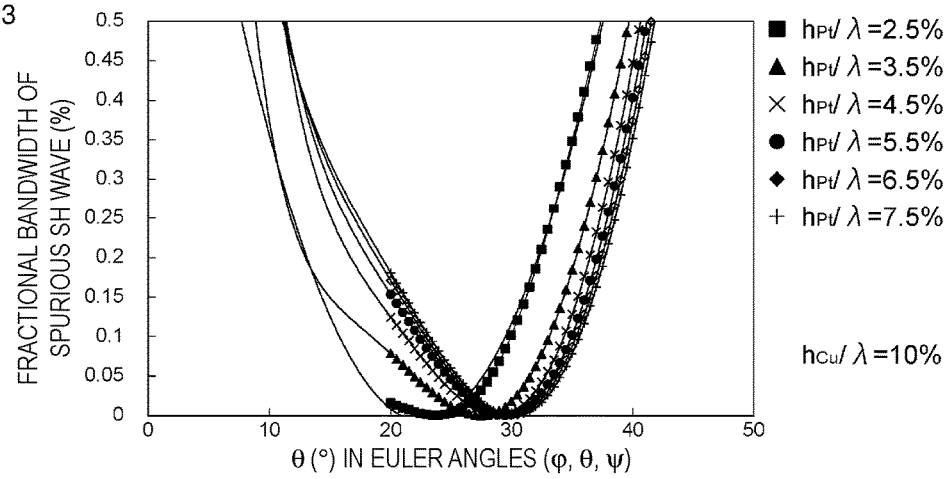
FIG. 23 is a graph indicating a relationship among the film thickness $h_{Pt}/\lambda$ of the first electrode layer, θ in the Euler Angles (φ, θ, ψ), and the fractional bandwidth of the spurious SH wave when the film thickness $h_{Cu}/\lambda$ of the second electrode layer is about 10% in the third preferred embodiment of the present invention.

FIG. 23 is a graph indicating a relationship among the film thickness $h_{Pt}/\lambda$ of the first electrode layer, $\theta$ in the Euler Angles ($\varphi$, $\theta$, $\psi$), and the fractional bandwidth of the spurious SH wave when the film thickness $h_{Cu}/\lambda$ of the second electrode layer is about 10% in the third preferred embodiment, for example. FIG. 23 illustrates the cases in which the film thickness $h_{Pt}/\lambda$ of the first electrode layer is about 2.5%, about 3.5%, about 4.5%, about 5.5%, about 6.5% and about 7.5%, for example.

As illustrated in FIG. 23, the fractional bandwidth of the spurious SH wave is able to be reduced or prevented to be equal to or lower than about 0.15%, for example, with the combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate as indicated in Table 12. Therefore, the spurious SH wave is able to be effectively reduced or prevented.

The effect that is the same or substantially the same as that described above is able to be obtained even when the Euler Angles ($\varphi$, $\theta$, $\psi$) of the piezoelectric substrate are the Euler Angles (0°±5°, $\theta$, 0°±5°), for example. In the specification, 0°±5° indicates being within a range of about 0°±5°.

An example of a method for manufacturing the elastic wave device according to a preferred embodiment of the present invention is described below.

First, the first electrode layer 3a1 is formed on the piezoelectric substrate 2 illustrated in FIG. 2. The first electrode layer 3a1 may be formed by, for example, a vapor deposition method or a sputtering method. Then, the second electrode layer 3a2 is laminated on the first electrode layer 3a1. The second electrode layer 3a2 may also be formed by, for example, the vapor deposition method or the sputtering method in the same or similar manner as the first electrode layer 3a1. The IDT electrode 3 is thus formed.

Thereafter, the dielectric film 4 is formed on the piezoelectric substrate 2 so as to cover the IDT electrode 3. The dielectric film 4 may be formed by, for example, a bias sputtering method. The elastic wave device 1 illustrated in FIG. 1 is thus provided.

It should be noted that a layer other than the first electrode layer 3a1 and the second electrode layer 3a2 may be laminated in a range without impairing the effect of preferred embodiments of the present invention. Furthermore, a frequency adjusting film made of SiN or other suitable material may be formed on the dielectric film 4. With this frequency adjusting film, the frequency is able to be easily adjusted.

The above-described elastic wave device may be used as a duplexer of a high-frequency front end circuit, or other suitable device. This example will be described below.

Figure 24:
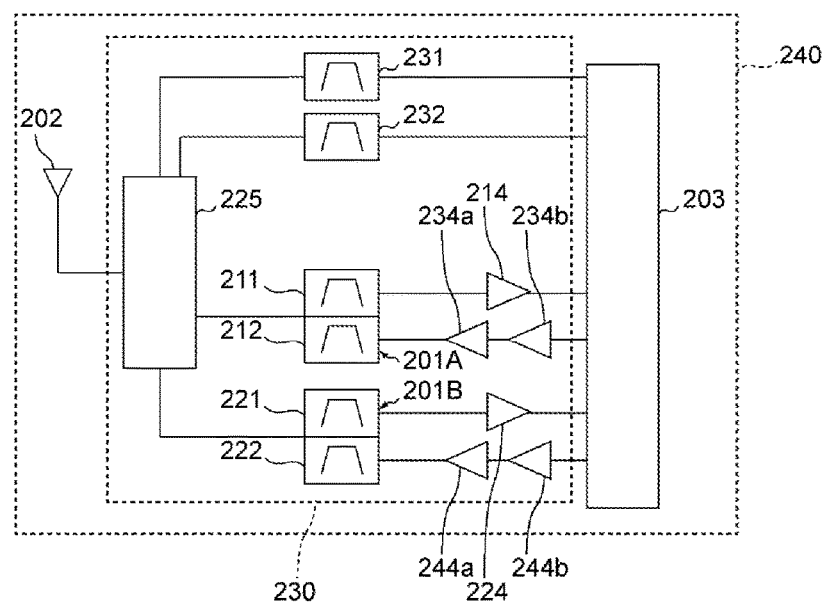
FIG. 24 is a configuration diagram of a communication apparatus including a high-frequency front end circuit.

FIG. 24 is a configuration diagram of a communication apparatus including a high-frequency front end circuit. FIG. 24 also illustrates respective components that are connected to a high-frequency front end circuit 230, for example, an antenna element 202 and an RF signal processing circuit (RFIC) 203. The high-frequency front end circuit 230 and the RF signal processing circuit 203 define a communication apparatus 240. It should be noted that the communication apparatus 240 may also include a power supply, a CPU (central processing unit), and a display and other components.

The high-frequency front end circuit 230 includes a switch 225, duplexers 201A and 201B, low noise amplifier circuits 214 and 224, filters 231 and 232, power amplifier circuits 234a, 234b, 244a, and 244b. The high-frequency front end circuit 230 and the communication apparatus 240 in FIG. 24 are examples of the high-frequency front end circuit and the communication apparatus, respectively, and they are not limited to these configurations.

The duplexer 201A includes filters 211 and 212. The duplexer 201B includes filters 221 and 222. The duplexers 201A and 201B are connected to the antenna element 202 with the switch 225 interposed therebetween. The above-described elastic wave device may be the duplexers 201A and 201B or the filters 211, 212, 221, and 222. The above-described elastic wave device may be elastic wave resonators defining the duplexers 201A and 201B and/or the filters 211, 212, 221, and 222. Moreover, the above-described elastic wave device is also able be applied to a multiplexer including three or more filters, such as a triplexer in which an antenna terminal is made common to three filters and a hexaplexer in which an antenna terminal is made common to six filters.

That is to say, the above-described elastic wave device may preferably include the elastic wave resonator, the filter, the duplexer, and the multiplexer including three or more filters. The multiplexer is not limited to a configuration including both of a transmission filter and a reception filter and may have a configuration including only the transmission filter or only the reception filter.

The switch 225 connects the antenna element 202 and a signal path corresponding to a predetermined band in accordance with a control signal from a controller (not illustrated), and is preferably defined by, for example, an SPDT (Single Pole Double Throw)-type switch. The signal path that is connected to the antenna element 202 is not limited to one and a plurality thereof may be connected to the antenna element 202. That is to say, the high-frequency front end circuit 230 may be compatible with carrier aggregation.

The low noise amplifier circuit 214 is a reception amplification circuit that amplifies a high-frequency signal (high-frequency reception signal in this example) after passing through the antenna element 202, the switch 225, and the duplexer 201A, and outputs it to the RF signal processing circuit 203. The low noise amplifier circuit 224 is a reception amplification circuit that amplifies a high-frequency signal (high-frequency reception signal in this example) after passing through the antenna element 202, the switch 225, and the duplexer 201B, and outputs it to the RF signal processing circuit 203.

The power amplifier circuits 234a and 234b are transmission amplification circuits that amplify a high-frequency signal (high-frequency transmission signal in this example) output from the RF signal processing circuit 203 and output it to the antenna element 202 after passing through the duplexer 201A and the switch 225. The power amplifier circuits 244a and 244b are transmission amplification circuits that amplify a high-frequency signal (high-frequency transmission signal in this example) output from the RF signal processing circuit 203 and output it to the antenna element 202 after passing through the duplexer 201B and the switch 225.

The filters 231 and 232 are connected between the RF signal processing circuit 203 and the switch 225 with no low noise amplifier circuit and no power amplifier circuit interposed therebetween. The filters 231 and 232 are also connected to the antenna element 202 with the switch 225 interposed therebetween in the same or similar manner as the duplexers 201A and 201B.

The RF signal processing circuit 203 performs signal processing on the high-frequency reception signal input from the antenna element 202 while passing through the reception signal path by down conversion, and outputs a reception signal generated by the signal processing. The RF signal processing circuit 203 performs signal processing on the input transmission signal by up conversion, and outputs a high-frequency transmission signal generated by the signal processing to the power amplifier circuits 234a, 234b, 244a, and 244b. The RF signal processing circuit 203 is preferably, for example, an RFIC. The signal obtained by processing by the RF signal processing circuit 203 is used, for example, as an image signal for image display or as an audio signal for telephone call. It should be noted that the high-frequency front end circuit 230 may include another circuit element between the above-described components.

The high-frequency front end circuit 230 may include duplexers according to variations on the duplexers 201A and 201B, instead of the duplexers 201A and 201B.

The filters 231 and 232 in the communication apparatus 240 are connected between the RF signal processing circuit 203 and the switch 225 with no low noise amplifier circuit and no power amplifier circuit interposed therebetween. The filters 231 and 232 are also connected to the antenna element 202 with the switch 225 interposed therebetween in the same or similar manner as the duplexers 201A and 201B.

The high-frequency front end circuit 230 and the communication apparatus 240 configured as described above is able to improve the trade-off relationship between the frequency temperature characteristic (TCV) and the fractional bandwidth by including the elastic wave resonator, the filter, the duplexer, the multiplexer including three or more filters, defined by the elastic wave device according to preferred embodiments of the present invention.

Hereinbefore, elastic wave devices, high-frequency front end circuits, and communication apparatuses according to preferred embodiments of the present invention have been described using the above-described preferred embodiments and variations thereon. The present invention also encompasses other preferred embodiments that are implemented by combining appropriate components in the above-described preferred embodiments and variations, variations obtained by adding various changes to the above-described preferred embodiments, which are conceived by those skilled in the art, without departing from the gist of the present invention, and various apparatuses incorporating the high-frequency front end circuit or the communication apparatus according to preferred embodiments of the present invention.

Preferred embodiments of the present invention may be widely used for communication apparatuses, such as a cellular phone as the elastic wave resonator, the filter, the duplexer, the multiplexer capable of being applied to a multiband system, the front end circuit, or the communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate;
an IDT electrode including a first electrode layer which is provided on the piezoelectric substrate and contains Pt as a main component and a second electrode layer which is laminated on the first electrode layer and contains Cu as a main component; and
a dielectric film that is provided on the piezoelectric substrate and covers the IDT electrode; wherein
the piezoelectric substrate is made of lithium niobate;
the dielectric film is made of silicon oxide;
the elastic wave device uses Rayleigh waves propagating along the piezoelectric substrate; and when a wavelength defined by an electrode finger pitch of the IDT electrode is λ, and a film thickness of the first electrode layer and a film thickness of the second electrode layer, which are normalized by the wavelength λ, are $h_{Pt}/\lambda(\%)$ and $h_{Cu}/\lambda(\%)$, respectively, an equation is satisfied:

$h_{Pt}/\lambda \geq -0.4 \times h_{Cu}/\lambda + 0.8$.

2. The elastic wave device according to claim 1, wherein a total of the film thickness $h_{Pt}/\lambda$ of the first electrode layer and the film thickness $h_{Cu}/\lambda$ of the second electrode layer is equal to or lower than about 20%.

3. The elastic wave device according to claim 1, wherein

Euler Angles (φ, θ, ψ) of the piezoelectric substrate are Euler Angles (0°±5°, θ, 0°±5°); and a combination of the film thickness $h_{Pt}/\lambda$ of the first electrode layer, the film thickness $h_{Cu}/\lambda$ of the second electrode layer, and θ in the Euler Angles (φ, θ, ψ) of the piezoelectric substrate is any one of combinations indicated in Table 1 to Table 6:

TABLE 1

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $0.8 \leq h_{Pt}/\lambda < 1.25$ | $34.2 \leq \theta \leq 42.6$ |
| $h_{Cu}/\lambda \leq 5.5$ | $1.25 \leq h_{Pt}/\lambda < 1.75$ | $33.7 \leq \theta \leq 46.3$ |
| $h_{Cu}/\lambda \leq 5.5$ | $1.75 \leq h_{Pt}/\lambda < 2.25$ | $32.8 \leq \theta \leq 54$ |
| $h_{Cu}/\lambda \leq 5.5$ | $2.25 \leq h_{Pt}/\lambda \leq 2.75$ | $32.8 \leq \theta \leq 61$ |

TABLE 2

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $3.5 \leq h_{Pt}/\lambda < 4.5$ | $16.3 \leq \theta \leq 30.8$ |
| $h_{Cu}/\lambda \leq 5.5$ | $4.5 \leq h_{Pt}/\lambda < 5.5$ | $17 \leq \theta \leq 34.7$ |
| $h_{Cu}/\lambda \leq 5.5$ | $5.5 \leq h_{Pt}/\lambda < 6.5$ | $19.8 \leq \theta \leq 35.8$ |
| $h_{Cu}/\lambda \leq 5.5$ | $6.5 \leq h_{Pt}/\lambda < 7.5$ | $21 \leq \theta \leq 36.3$ |
| $h_{Cu}/\lambda \leq 5.5$ | $7.5 \leq h_{Pt}/\lambda \leq 8.5$ | $21.5 \leq \theta \leq 36.6$ |

TABLE 3

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $5.5 < h_{Cu}/\lambda \leq 8.5$ | $0.8 \leq h_{Pt}/\lambda < 1.25$ | $32.6 \leq \theta \leq 54.7$ |
| $5.5 < h_{Cu}/\lambda \leq 8.5$ | $1.25 \leq h_{Pt}/\lambda < 1.75$ | $32.3 \leq \theta \leq 65.5$ |
| $5.5 < h_{Cu}/\lambda \leq 8.5$ | $1.75 \leq h_{Pt}/\lambda \leq 2.25$ | $34.5 \leq \theta \leq 55.5$ |

TABLE 4

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $5.5 < h_{Cu}/\lambda \leq 8.5$ | $2.5 \leq h_{Pt}/\lambda < 3.5$ | $14.7 \leq \theta \leq 29.5$ |
| $5.5 < h_{Cu}/\lambda \leq 8.5$ | $3.5 \leq h_{Pt}/\lambda < 4.5$ | $20.2 \leq \theta \leq 34.2$ |
| $5.5 < h_{Cu}/\lambda \leq 8.5$ | $4.5 \leq h_{Pt}/\lambda < 5.5$ | $19 \leq \theta \leq 35.5$ |
| $5.5 < h_{Cu}/\lambda \leq 8.5$ | $5.5 \leq h_{Pt}/\lambda < 6.5$ | $20.5 \leq \theta \leq 36.2$ |
| $5.5 < h_{Cu}/\lambda \leq 8.5$ | $6.5 \leq h_{Pt}/\lambda < 7.5$ | $21.2 \leq \theta \leq 36.5$ |
| $5.5 < h_{Cu}/\lambda \leq 8.5$ | $7.5 \leq h_{Pt}/\lambda \leq 8.5$ | $21.5 \leq \theta \leq 36.7$ |

TABLE 5

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $8.5 < h_{Cu}/\lambda \leq 11.5$ | $0.8 \leq h_{Pt}/\lambda \leq 1.25$ | $33 \leq \theta \leq 56.5$ |

TABLE 6

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $8.5 < h_{Cu}/\lambda \leq 11.5$ | $2.0 \leq h_{Pt}/\lambda < 3.0$ | $14.3 \leq \theta \leq 30.9$ |
| $8.5 < h_{Cu}/\lambda \leq 11.5$ | $3.0 \leq h_{Pt}/\lambda < 4.0$ | $15 \leq \theta \leq 34.3$ |
| $8.5 < h_{Cu}/\lambda \leq 11.5$ | $4.0 \leq h_{Pt}/\lambda < 5.0$ | $18.8 \leq \theta \leq 35.5$ |
| $8.5 < h_{Cu}/\lambda \leq 11.5$ | $5.0 \leq h_{Pt}/\lambda < 6.0$ | $20.2 \leq \theta \leq 36.2$ |
| $8.5 < h_{Cu}/\lambda \leq 11.5$ | $6.0 \leq h_{Pt}/\lambda < 7.0$ | $20.8 \leq \theta \leq 36.5$ |
| $8.5 < h_{Cu}/\lambda \leq 11.5$ | $7.0 \leq h_{Pt}/\lambda \leq 8.0$ | $21.2 \leq \theta \leq 36.8$. |

4. The elastic wave device according to claim 1, wherein Euler Angles (φ, θ, ψ) of the piezoelectric substrate are Euler Angles (0°, 37.5°, 0°).

5. The elastic wave device according to claim 1, wherein the dielectric film is made of $SiO_2$.

6. A high-frequency front end circuit comprising:

the elastic wave device according to claim 1; and a power amplifier.

7. The high-frequency front end circuit according to claim 6, wherein a total of the film thickness $h_{Pt}/\lambda$ of the first electrode layer and the film thickness $h_{Cu}/\lambda$ of the second electrode layer is equal to or lower than about 20%.

8. The high-frequency front end circuit according to claim 6, wherein

Euler Angles (φ, θ, ψ) of the piezoelectric substrate are Euler Angles (0°±5°, θ, 0°±5°); and a combination of the film thickness $h_{Pt}/\lambda$ of the first electrode layer, the film thickness $h_{Cu}/\lambda$ of the second electrode layer, and θ in the Euler Angles (φ, θ, ψ) of the piezoelectric substrate is any one of combinations indicated in Table 1 to Table 6:

TABLE 1

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $0.8 \leq h_{Pt}/\lambda < 1.25$ | $34.2 \leq \theta \leq 42.6$ |
| $h_{Cu}/\lambda \leq 5.5$ | $1.25 \leq h_{Pt}/\lambda < 1.75$ | $33.7 \leq \theta \leq 46.3$ |
| $h_{Cu}/\lambda \leq 5.5$ | $1.75 \leq h_{Pt}/\lambda < 2.25$ | $32.8 \leq \theta \leq 54$ |
| $h_{Cu}/\lambda \leq 5.5$ | $2.25 \leq h_{Pt}/\lambda \leq 2.75$ | $32.8 \leq \theta \leq 61$ |

TABLE 2

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | θ (°) |
|---|---|---|
| $h_{Cu}/\lambda \leq 5.5$ | $3.5 \leq h_{Pt}/\lambda < 4.5$ | $16.3 \leq \theta \leq 30.8$ |
| $h_{Cu}/\lambda \leq 5.5$ | $4.5 \leq h_{Pt}/\lambda < 5.5$ | $17 \leq \theta \leq 34.7$ |
| $h_{Cu}/\lambda \leq 5.5$ | $5.5 \leq h_{Pt}/\lambda < 6.5$ | $19.8 \leq \theta \leq 35.8$ |
| $h_{Cu}/\lambda \leq 5.5$ | $6.5 \leq h_{Pt}/\lambda < 7.5$ | $21 \leq \theta \leq 36.3$ |
| $h_{Cu}/\lambda \leq 5.5$ | $7.5 \leq h_{Pt}/\lambda \leq 8.5$ | $21.5 \leq \theta \leq 36.6$ |

TABLE 3

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $5.5 < h_{Cu}/\lambda \leq 8.5$ | $0.8 \leq h_{Pt}/\lambda < 1.25$ | $32.6 \leq \theta \leq 54.7$ |
| $5.5 < h_{Cu}/\lambda \leq 8.5$ | $1.25 \leq h_{Pt}/\lambda < 1.75$ | $32.3 \leq \theta \leq 65.5$ |
| $5.5 < h_{Cu}/\lambda \leq 8.5$ | $1.75 \leq h_{Pt}/\lambda \leq 2.25$ | $34.5 \leq \theta \leq 55.5$ |

TABLE 4

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $5.5 < h_{Cu}/\lambda \leq 8.5$ | $2.5 \leq h_{Pt}/\lambda < 3.5$ | $14.7 \leq \theta \leq 29.5$ |
| $5.5 < h_{Cu}/\lambda \leq 8.5$ | $3.5 \leq h_{Pt}/\lambda < 4.5$ | $20.2 \leq \theta \leq 34.2$ |
| $5.5 < h_{Cu}/\lambda \leq 8.5$ | $4.5 \leq h_{Pt}/\lambda < 5.5$ | $19 \leq \theta \leq 35.5$ |
| $5.5 < h_{Cu}/\lambda \leq 8.5$ | $5.5 \leq h_{Pt}/\lambda < 6.5$ | $20.5 \leq \theta \leq 36.2$ |
| $5.5 < h_{Cu}/\lambda \leq 8.5$ | $6.5 \leq h_{Pt}/\lambda < 7.5$ | $21.2 \leq \theta \leq 36.5$ |
| $5.5 < h_{Cu}/\lambda \leq 8.5$ | $7.5 \leq h_{Pt}/\lambda \leq 8.5$ | $21.5 \leq \theta \leq 36.7$ |

TABLE 5

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $8.5 < h_{Cu}/\lambda \leq 11.5$ | $0.8 \leq h_{Pt}/\lambda \leq 1.25$ | $33 \leq \theta \leq 56.5$ |

TABLE 6

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $8.5 < h_{Cu}/\lambda \leq 11.5$ | $2.0 \leq h_{Pt}/\lambda < 3.0$ | $14.3 \leq \theta \leq 30.9$ |
| $8.5 < h_{Cu}/\lambda \leq 11.5$ | $3.0 \leq h_{Pt}/\lambda < 4.0$ | $15 \leq \theta \leq 34.3$ |
| $8.5 < h_{Cu}/\lambda \leq 11.5$ | $4.0 \leq h_{Pt}/\lambda < 5.0$ | $18.8 \leq \theta \leq 35.5$ |
| $8.5 < h_{Cu}/\lambda \leq 11.5$ | $5.0 \leq h_{Pt}/\lambda < 6.0$ | $20.2 \leq \theta \leq 36.2$ |
| $8.5 < h_{Cu}/\lambda \leq 11.5$ | $6.0 \leq h_{Pt}/\lambda < 7.0$ | $20.8 \leq \theta \leq 36.5$ |
| $8.5 < h_{Cu}/\lambda \leq 11.5$ | $7.0 \leq h_{Pt}/\lambda \leq 8.0$ | $21.2 \leq \theta \leq 36.8$ |

9. The high-frequency front end circuit according to claim 6, wherein Euler Angles ($\varphi$, $\theta$, $\psi$) of the piezoelectric substrate are Euler Angles (0°, 37.5°, 0°).

10. The high-frequency front end circuit according to claim 6, wherein the dielectric film is made of $SiO_2$.

11. A communication apparatus comprising:

the high-frequency front end circuit according to claim 6;

an RF signal processing circuit; and a baseband signal processing circuit.

12. The communication apparatus according to claim 11, wherein a total of the film thickness $h_{Pt}/\lambda$ of the first electrode layer and the film thickness $h_{Cu}/\lambda$ of the second electrode layer is equal to or lower than about 20%.

13. The communication apparatus according to claim 11, wherein

Euler Angles ($\varphi$, $\theta$, $\psi$) of the piezoelectric substrate are Euler Angles (0°±5°, $\theta$, 0°±5°); and a combination of the film thickness $h_{Pt}/\lambda$ of the first electrode layer, the film thickness $h_{Cu}/\lambda$ of the second electrode layer, and $\theta$ in the Euler Angles ($\varphi$, $\theta$, $\psi$) of the piezoelectric substrate is any one of combinations indicated in Table 1 to Table 6:

TABLE 1

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $h_{Cu}/\lambda \leq 5.5$ | $0.8 \leq h_{Pt}/\lambda < 1.25$ | $34.2 \leq \theta \leq 42.6$ |
| $h_{Cu}/\lambda \leq 5.5$ | $1.25 \leq h_{Pt}/\lambda < 1.75$ | $33.7 \leq \theta \leq 46.3$ |
| $h_{Cu}/\lambda \leq 5.5$ | $1.75 \leq h_{Pt}/\lambda < 2.25$ | $32.8 \leq \theta \leq 54$ |
| $h_{Cu}/\lambda \leq 5.5$ | $2.25 \leq h_{Pt}/\lambda \leq 2.75$ | $32.8 \leq \theta \leq 61$ |

TABLE 2

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $h_{Cu}/\lambda \leq 5.5$ | $3.5 \leq h_{Pt}/\lambda < 4.5$ | $16.3 \leq \theta \leq 30.8$ |
| $h_{Cu}/\lambda \leq 5.5$ | $4.5 \leq h_{Pt}/\lambda < 5.5$ | $17 \leq \theta \leq 34.7$ |
| $h_{Cu}/\lambda \leq 5.5$ | $5.5 \leq h_{Pt}/\lambda < 6.5$ | $19.8 \leq \theta \leq 35.8$ |
| $h_{Cu}/\lambda \leq 5.5$ | $6.5 \leq h_{Pt}/\lambda < 7.5$ | $21 \leq \theta \leq 36.3$ |
| $h_{Cu}/\lambda \leq 5.5$ | $7.5 \leq h_{Pt}/\lambda \leq 8.5$ | $21.5 \leq \theta \leq 36.6$ |

TABLE 3

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $5.5 < h_{Cu}/\lambda \leq 8.5$ | $0.8 \leq h_{Pt}/\lambda < 1.25$ | $32.6 \leq \theta \leq 54.7$ |
| $5.5 < h_{Cu}/\lambda \leq 8.5$ | $1.25 \leq h_{Pt}/\lambda < 1.75$ | $32.3 \leq \theta \leq 65.5$ |
| $5.5 < h_{Cu}/\lambda \leq 8.5$ | $1.75 \leq h_{Pt}/\lambda \leq 2.25$ | $34.5 \leq \theta \leq 55.5$ |

TABLE 4

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $5.5 < h_{Cu}/\lambda \leq 8.5$ | $2.5 \leq h_{Pt}/\lambda < 3.5$ | $14.7 \leq \theta \leq 29.5$ |
| $5.5 < h_{Cu}/\lambda \leq 8.5$ | $3.5 \leq h_{Pt}/\lambda < 4.5$ | $20.2 \leq \theta \leq 34.2$ |
| $5.5 < h_{Cu}/\lambda \leq 8.5$ | $4.5 \leq h_{Pt}/\lambda < 5.5$ | $19 \leq \theta \leq 35.5$ |
| $5.5 < h_{Cu}/\lambda \leq 8.5$ | $5.5 \leq h_{Pt}/\lambda < 6.5$ | $20.5 \leq \theta \leq 36.2$ |
| $5.5 < h_{Cu}/\lambda \leq 8.5$ | $6.5 \leq h_{Pt}/\lambda < 7.5$ | $21.2 \leq \theta \leq 36.5$ |
| $5.5 < h_{Cu}/\lambda \leq 8.5$ | $7.5 \leq h_{Pt}/\lambda \leq 8.5$ | $21.5 \leq \theta \leq 36.7$ |

TABLE 5

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $8.5 < h_{Cu}/\lambda \leq 11.5$ | $0.8 \leq h_{Pt}/\lambda \leq 1.25$ | $33 \leq \theta \leq 56.5$ |

TABLE 6

| FILM THICKNESS OF SECOND ELECTRODE LAYER $h_{Cu}/\lambda$ (%) | FILM THICKNESS OF FIRST ELECTRODE LAYER $h_{PT}/\lambda$ (%) | $\theta$ (°) |
|---|---|---|
| $8.5 < h_{Cu}/\lambda \leq 11.5$ | $2.0 \leq h_{Pt}/\lambda < 3.0$ | $14.3 \leq \theta \leq 30.9$ |
| $8.5 < h_{Cu}/\lambda \leq 11.5$ | $3.0 \leq h_{Pt}/\lambda < 4.0$ | $15 \leq \theta \leq 34.3$ |
| $8.5 < h_{Cu}/\lambda \leq 11.5$ | $4.0 \leq h_{Pt}/\lambda < 5.0$ | $18.8 \leq \theta \leq 35.5$ |
| $8.5 < h_{Cu}/\lambda \leq 11.5$ | $5.0 \leq h_{Pt}/\lambda < 6.0$ | $20.2 \leq \theta \leq 36.2$ |
| $8.5 < h_{Cu}/\lambda \leq 11.5$ | $6.0 \leq h_{Pt}/\lambda < 7.0$ | $20.8 \leq \theta \leq 36.5$ |
| $8.5 < h_{Cu}/\lambda \leq 11.5$ | $7.0 \leq h_{Pt}/\lambda \leq 8.0$ | $21.2 \leq \theta \leq 36.8$ |

14. The communication apparatus according to claim 11, wherein Euler Angles ($\varphi$, $\theta$, $\psi$) of the piezoelectric substrate are Euler Angles (0°, 37.5°, 0°).

15. The communication apparatus according to claim 11, wherein the dielectric film is made of $SiO_2$.

* * * * *